United States Patent
Wang (10) Patent No.: US 11,753,586 B2
(45) Date of Patent: Sep. 12, 2023

(54) MANUFACTURING METHOD OF MATERIAL OF LIGHT EMITTING LAYER

(71) Applicant: TCL CHINA STAR OPTOELECTRONICS TECHNOLOGY CO., LTD., Guangdong (CN)

(72) Inventor: Yanan Wang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/873,219

(22) Filed: Jul. 26, 2022

(65) Prior Publication Data
US 2022/0380665 A1    Dec. 1, 2022

Related U.S. Application Data (62) Division of application No. 16/765,527, filed as application No. PCT/CN2020/086690 on Apr. 24, 2020, now abandoned.

(30) Foreign Application Priority Data

Apr. 1, 2020 (CN) .......................... 202010251480.4

(51) Int. Cl.
C09K 11/02 (2006.01)
C09K 11/66 (2006.01)
(Continued)

(52) U.S. Cl.
CPC ............ *C09K 11/025* (2013.01); *C09K 11/66* (2013.01); *C09K 11/77* (2013.01); *H10K 50/865* (2023.02);
(Continued)

(58) Field of Classification Search
CPC ..... C09K 11/025; H10K 85/60; H10K 50/115
See application file for complete search history.

(56) References Cited

U.S. PATENT DOCUMENTS

2013/0341570 A1    12/2013   Chan et al.

FOREIGN PATENT DOCUMENTS

| CN | 104681418 A | 6/2015 |
| CN | 107145022 A | 9/2017 |

(Continued)

OTHER PUBLICATIONS

Xue et al, "Optically Active Upconverting Nanoparticles with Induced Circularly Polarized Luminescence and Enantioselectively Triggered Photopolymerization," ACS Nano, vol. 13, No. 3, Jan. 28, 2019 (Jan. 28, 2019), pp. 2804-2811 (Year: 2019).*

(Continued)

*Primary Examiner* — Anthony Ho
(74) *Attorney, Agent, or Firm* — Mark M. Friedman (57) ABSTRACT

A material of a light emitting layer, a manufacturing method thereof, and an electroluminescent device are disclosed. The material of the light emitting layer includes a spiral nanotube structure and luminescent particles. The manufacturing method of the material of the light emitting layer includes steps of manufacturing the spiral nanotube structure and steps of manufacturing a guest-host structure. The manufacturing method is easily achieved, and a compatibility of the material is high.

2 Claims, 3 Drawing Sheets

(51) Int. Cl.
  *C09K 11/77* (2006.01)
  *H10K 50/86* (2023.01)
  *H10K 85/60* (2023.01)
  *H10K 50/115* (2023.01)
  *H10K 71/00* (2023.01)

(52) U.S. Cl.
  CPC ........... *H10K 85/60* (2023.02); *H10K 50/115* (2023.02); *H10K 71/311* (2023.02)

(56) References Cited

FOREIGN PATENT DOCUMENTS

| | | |
|---|---|---|
| CN | 108492908 A | 9/2018 |
| CN | 109438770 A | 3/2019 |
| CN | 209278065 U | 8/2019 |

OTHER PUBLICATIONS

International Search Report in International application No. PCT/CN2020/086690, dated Jan. 11, 2021.
Written Opinion of the International Search Authority in International application No. PCT/CN2020/086690, dated Jan. 11, 2021.
Chinese Office Action issued in corresponding Chinese Patent Application No. 202010251480.4 dated Oct. 23, 2020, pp. 1-33.
Chinese Office Action issued in corresponding Chinese Patent Application No. 202010251480.4 dated Mar. 17, 2021, pp. 1-6.

* cited by examiner

MANUFACTURING METHOD OF MATERIAL OF LIGHT EMITTING LAYER

CROSS REFERENCE TO RELATED APPLICATION

The present application is a Divisional application of the U.S. application Ser. No. 16/765,527 filed on May 20, 2020, which claims a priority from China Patent Application No. 202010251480.4 filed on Apr. 1, 2020 and is herein incorporated by reference.

FIELD OF INVENTION

The present disclosure relates to the field of display technology, and in particular, to a material of a light emitting layer, a manufacturing method thereof, and an electroluminescent device.

BACKGROUND OF INVENTION

Currently, organic light-emitting diode (OLED) devices are superior to liquid crystal displays (LCDs) in the display industry and have become a main representative of high-end markets, since the OLED devices have advantages of a desired display effect, light weight, and achievable curved display. However, on the contrary to the display of the OLED, costs and display lifespans of the OLED devices are still aspects required to be continuously improved. In structures of the OLED devices, in addition to light emitting parts, polarizers play a considerably important role in the display effect of the OLED devices. Due to a serious metal reflection in the devices, the OLED devices require to absorb ambient light with the polarizers to maintain a luminance contrast of the OLED itself. Like the LCDs, the addition of the polarizers causes an overall light extraction efficiency to be lost by more than one-half. If this part could be improved to reduce the loss of light energy, it will greatly contribute to the display lifespans of the OLED devices.

Therefore, a material of a light emitting layer, a manufacturing method thereof, and an electroluminescent device are necessary to be provided to overcome the problems existing in the conventional technology.

SUMMARY OF INVENTION

Technical Problem

For the above shortcomings and defects existing in the conventional technology, one of purposes in the present disclosure is to provide a material of a light emitting layer and a manufacturing method thereof. Emitted light may be modulated to circularly polarized light by using chiral properties of the material of the light emitting layer. In comparison to synthesizing a light emitting material which directly emits the circularly polarized light, the method is easily achieved, and a compatibility of the material is high.

Technical Solutions

Another purpose of the present disclosure is to provide an electroluminescent device. A light emitting layer of the electroluminescent device employs the material of the light emitting layer. A light extraction efficiency may be increased by 40% to 50% by changing a polarization state of light emitted by the electroluminescent device and using a circular polarizer, thereby enhancing the light extraction efficiency of the device, and improving the light-emitting lifespan of the electroluminescent device as well.

In order to achieve the above-mentioned purposes, the present disclosure provides a material of the light emitting layer including a spiral nanotube structure and luminescent particles uniformly distributed in the spiral nanotube structure.

Furthermore, a particle diameter of the spiral nanotube structure ranges from 20 nm to 40 nm, and a particle diameter of the luminescent particles ranges from 1 nm to 100 nm.

Furthermore, material of the spiral nanotube structure is a single chirality nanotube material.

Furthermore, a chemical structural formula of the spiral nanotube structure is:

Moreover, material of the luminescent particles includes at least one of quantum dot luminescent particles, lanthanide nanocrystals, and perovskite nanocrystals.

Moreover, the material of the light emitting layer further includes dimethylformamide.

The present disclosure further provides a manufacturing method of the material of the light emitting layer including steps of:

manufacturing a spiral nanotube structure and providing luminescent particles; and mixing a quantity of the spiral nanotube structure with a quantity of the luminescent particles to obtain a mixture, adding the mixture to a dimethylformamide solvent, and heating the mixture and the dimethylformamide solvent in a closed environment until the mixture dissolved in the dimethylformamide solvent, followed by standing and cooling the mixture to a room temperature, so that the luminescent particles are uniformly distributed in the spiral nanotube structure.

Furthermore, when a particle diameter of the luminescent particles ranges from 20 nm to 40 nm, a proportion of the spiral nanotube structure to the luminescent particles is (10 to 17):1; and when the particle diameter of the luminescent particles is equal to or greater than 1 nm and less than 20 nm, and/or is greater than 40 nm and equal to or less than 100 nm, the proportion of the spiral nanotube structure to the luminescent particles is (5 to 30):1.

Furthermore, the step of manufacturing the spiral nanotube structure include:

placing N-tert-butoxycarbonyl-L-glutamic acid, octadecylamine, and a catalyst into a reaction vessel to fully react and obtain a first reaction solution, and adding tetrahydrofuran into the first reaction solution to dissolve residual reactants, thus purifying and obtaining intermediate compounds;

placing the intermediate compounds, dichloromethane, and trifluoroacetic acid into a reaction vessel to fully react and obtain a second reaction solution, using a rotary evaporator to remove excess solvent in the second reaction solution, and dissolving residual reactants in tetrahydrofuran, followed by adding the residual reactants into sodium bicarbonate solution, thus obtaining a target compound being a white and solid substance;

adding the target compound into tetrahydrofuran, and performing recrystallization purification; and mixing a quantity of the purified target compound with a quantity of alcohol solvent to obtain a mixture, heating the mixture to boil in a closed environment, and cooling the mixture to a room temperature, thus forming the spiral tube structure.

The present disclosure further provides an electroluminescent device including the above-mentioned material of the light emitting layer.

Furthermore, the electroluminescent device further includes a circular polarizer disposed on the light emitting layer.

Advantageous Effects

Technical effects of the present disclosure are that the present disclosure provides a material of a light emitting layer and a manufacturing method thereof, and the emitted light may be modulated to the circularly polarized light by using the chiral properties of the material of the light emitting layer. In comparison to synthesizing the light emitting material which directly emits the circularly polarized light, the method is easily achieved, and the compatibility of the material is high. The present disclosure also provides an electroluminescent device. The light emitting layer of the electroluminescent device employs the material of the light emitting layer. The light extraction efficiency may be increased by 40% to 50% by changing the polarization state of the light emitted by the electroluminescent device and using a circular polarizer, thereby enhancing the light extraction efficiency of the device, and improving the light-emitting lifespan of the electroluminescent device as well.

A part of components is marked as follows:

10 material of light emitting layer, 11 spiral nanotube structure, 12 luminescent particle, 13 dimethylformamide, 20 electroluminescent device, 21 light emitting layer, 22 circular polarizer, 221 $\lambda/4$ wave plate, 222 linear polarizer, 31 ambient light, 32 emitted light

DETAILED DESCRIPTION OF PREFERRED EMBODIMENTS

In combination with accompanying drawings in embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts fall within the protection scope of the present disclosure.

The term "made by" is synonymous with the term "comprise". The terms herein "comprise", "include", "have", "contain", or any other variants mean "including but not limited to". For example, a composition, step, method, product, or device containing the listed elements is not necessary to be limited to those elements, but may include other elements which are not explicitly listed or elements which are inherent in such a composition, step, method, product, or device.

The terms "first" and "second" are merely used for descriptive purposes, and cannot be understood to indicate or imply the relative importance or implicitly specify the number of the indicated technical features. Thus, the features defined by "first" and "second" may explicitly or implicitly include one or more of the features. In the description of the present disclosure, the term "a plurality of" means two or more than two, unless specifically defined otherwise.

Besides, it should be noted that steps of all methods described herein can occur out of the order in some alternative implementations. For example, two steps shown to be in succession may actually be performed substantially simultaneously, or the two steps may sometimes be performed in the reverse order.

Figure 1:
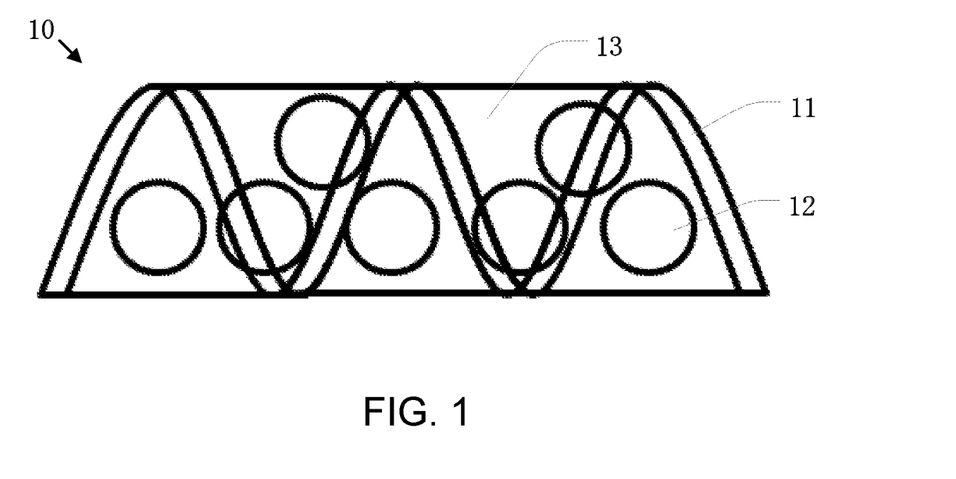
FIG. 1 is a structural schematic view of material of a light emitting layer described in embodiments of the present disclosure.

As shown in FIG. 1, the present disclosure provides a material of a light emitting layer 10 including a spiral nanotube structure 11 and luminescent particles 12, which present a guest-host structure. A main body of the guest-host structure is the spiral nanotube structure 11, and the luminescent particles 12 are uniformly distributed in the spiral nanotube structure 11, especially in a tubular structure of the spiral nanotube structure 11.

Material of the spiral nanotube structure 11 has chiral properties, so that the material of the light emitting layer 10 has chiral properties. The chiral properties of the material of the light emitting layer 10 may modulate emitted light to circularly polarized light. In comparison to synthesizing a light emitting material which directly emits the circularly polarized light, the method is easily achieved, and a compatibility of the material is high.

In the embodiments, in the material of the light emitting layer 10, a particle diameter of the spiral nanotube structure 11 ranges from 20 nm to 40 nm, and a particle diameter of the luminescent particles 12 ranges from 1 nm to 100 nm.

In the embodiments, material of the spiral nanotube structure 11 is a single chirality nanotube material.

In the embodiments, a chemical structural formula of the spiral nanotube structure 11 is:

In the embodiments, material of the luminescent particles 12 includes quantum dot luminescent particles, lanthanide nanocrystals, or perovskite nanocrystals.

In the embodiments, material of the luminescent particles 12 further includes dimethylformamide 13.

The present disclosure also provides a manufacturing method of the material of a light emitting layer 10 including steps of:

S1: manufacturing the spiral nanotube structure 11 and providing the luminescent particles 12; and S2: mixing a quantity of the spiral nanotube structure 11 with a quantity of the luminescent particles 12 to obtain a mixture, adding the mixture to a dimethylformamide solvent, and heating the mixture and the dimethylformamide solvent in a closed environment until the mixture dissolved in the dimethylformamide solvent, followed by standing (about 30 min to 60 min) and cooling the mixture to a room temperature, thus forming the guest-host structure in which the luminescent particles 12 are uniformly distributed in a tubular space of the spiral nanotube structure 11.

In the embodiments, the particle diameter of the spiral nanotube structure 11 ranges from 20 nm to 40 nm, and the particle diameter of the luminescent particles 12 ranges from 1 nm to 100 nm.

In the embodiments, when the particle diameter of the luminescent particles ranges from 20 nm to 40 nm, a proportion of the spiral nanotube structure 11 to the luminescent particles 12 is (10 to 17):1; and when the particle diameter of the luminescent particles 12 is equal to or greater than 1 nm and less than 20 nm, and/or is greater than 40 nm and equal to or less than 100 nm, the proportion of the spiral nanotube structure 11 to the luminescent particles 12 is (5 to 30):1.

In the embodiments, the material of the spiral nanotube structure 11 is a single chirality nanotube material.

In the manufacturing method of the material of the light emitting layer 10, the chiral properties of the material of the light emitting layer 10 may modulate the emitted light to the circularly polarized light. In comparison to synthesizing the light emitting material which directly emits the circularly polarized light, the method is easily achieved, and the compatibility of the material is high.

In order to illustrate the manufacturing method for manufacturing the spiral nanotube structure 11 of the present disclosure in detail, a reaction formula is provided, substantially as shown in formula (1):

Formula (1)

The step S1 of manufacturing the spiral nanotube structure 11 of the embodiments is illustrated in detail by combining with the formula (1) below, including the steps as follows:

a step S11 of placing N-tert-butoxycarbonyl-L-glutamic acid, octadecylamine, and a catalyst into a reaction vessel to fully react and obtain a first reaction solution, and adding tetrahydrofuran into the first reaction solution to dissolve residual reactants, thus purifying and obtaining intermediate compounds; wherein the N-tert-butoxycarbonyl-L-glutamic acid is obtained by protecting the glutamic acid with the tert-butoxycarbonyl group in advance; in formula (1), the catalyst includes 1-Hydroxybenzotriazole (HOBt), carbodiimide (EDC), and hydrochloric acid (HCl), the hydrochloric acid is used to remove protecting groups of the intermediate compounds, that is, the tert-butoxycarbonyl group is removed, and a chemical structural formula of the intermediate compounds is:

a step S12 of placing the intermediate compounds (3.575 g, 4.77 mmol), dichloromethane ($CH_2Cl_2$)(50 mL), and trifluoroacetic acid ($CF_3COOH$)(8 mL) into a reaction vessel, mixing the intermediate compounds, the dichloromethane, and the trifluoroacetic acid in a room temperature for about 3 hours to fully react and obtain a second reaction solution, using a rotary evaporator to remove excess solvent in the second reaction solution, and dissolving residual reactants in tetrahydrofuran (THF), followed by adding the residual reactants into sodium bicarbonate solution ($NaHCO_3$), thus obtaining a target compound being a white and solid substance; wherein in the formula (1), a chemical structural formula of the target compound is the chemical structural formula of the spiral nanotube structure 11 as follows:

a step S13 of adding the target compound into tetrahydrofuran, and performing recrystallization purification; and a step S14 of mixing a quantity of the purified target compound with a quantity of alcohol solvent to obtain a mixture, heating the mixture to boil, i.e., at 75° C., in a closed environment for 3 minutes and cooling the mixture to a room temperature with a cooling rate of 10° C./min, thus forming the spiral tube structure.

Figure 2:
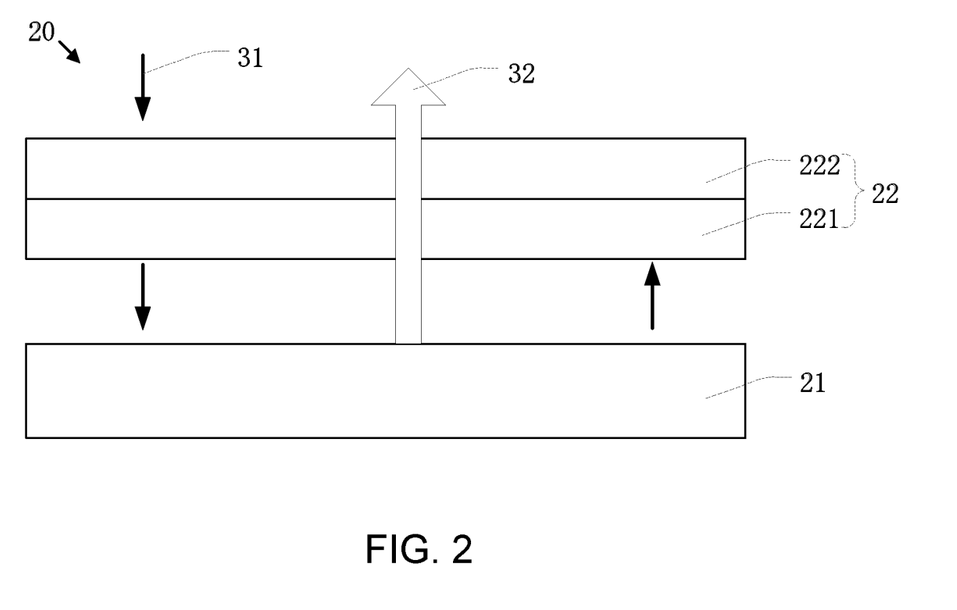
FIG. 2 is a structural schematic view of an electroluminescent device described in embodiments of the present disclosure.

As shown in FIG. 2, the present disclosure also provides an electroluminescent device 20 including a light emitting layer 21 and a circular polarizer 22 which are stacked with each other. The circular polarizer 22 is disposed on the light emitting layer 21. Material used for the light emitting layer 21 is the above-mentioned material of the light emitting layer 10.

The manufacturing of the light emitting layer 21 may be performed by using the inkjet printing or other fixed-point coating methods. Based on different color matching, the material of the film layer is coated on or shaped in a pixel structure with the corresponding color.

As shown in FIG. 2, according to a work principle of the electroluminescent device 20, after ambient light 31 is reflected, the reflected ambient light 31 is emitted by the circular polarizer 22 again. After the ambient light passed the circular polarizer 22 twice, light energy is entirely absorbed. A structural change of the light emitting layer 21 does not affect a blocking effect of the circular polarizer on the ambient light 31.

Figure 3:
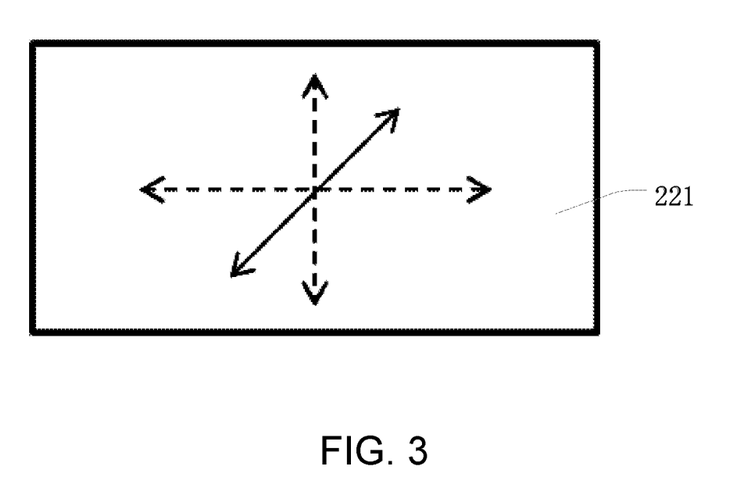
FIG. 3 is a structural schematic view of a circular polarizer in FIG. 2.
Figure 4:
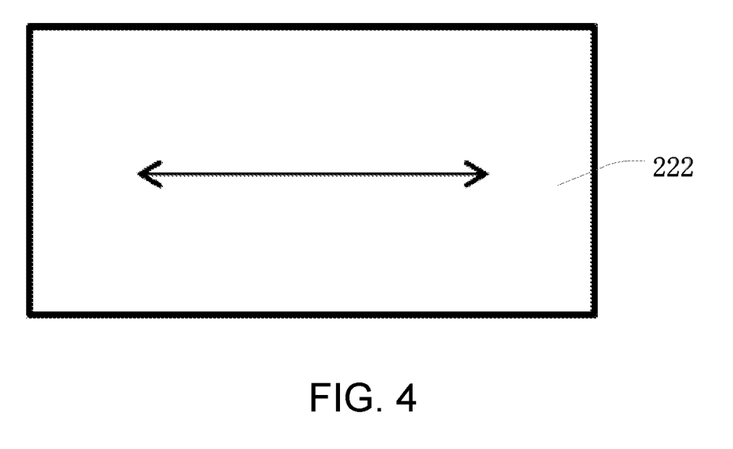
FIG. 4 is a structural schematic view of a linear polarizer in FIG. 2.

The circular polarizer 22 includes a λ/4 wave plate 221 and a linear polarizer 222. FIG. 3 is a structural schematic view of the λ/4 wave plate 221, and FIG. 4 is a structural schematic view of the linear polarizer 222. In order to ensure the electroluminescent device 20 achieves a highest light extraction efficiency, a polarization state of the emitted light 32 of the electroluminescent device 20 requires to correspond to arrangement of a polarization axis of the polarizer. Because the ambient light 31 and the emitted light 32 are the circularly polarized light, the arrangement of the linear polarizer 222 requires to ensure that the emitted light in the polarization state entirely passes the polarizer 222. For example, if an angle between the light axes which are a light transmission axis of the linear polarizer 222 shown in FIG. 4 (represented by a line segment in FIG. 4) and a light transmission axis of the λ/4 wave plate 221 shown in FIG. 3 (represented by a line segment in FIG. 3) is 45 degrees in a counterclockwise direction, the emitted light of the electroluminescent device 20 is configured to be right-handed polarized light, and a chiral direction of the spiral nanotube structure 11 which is selected to compose the light emitting layer 21 is right-handed. If an angle between the light axes is 135 degrees in a counterclockwise direction, the emitted light of the electroluminescent device 20 is configured to be left-handed polarized light, and a chiral direction of the spiral nanotube structure 11 which is selected to compose the light emitting layer 21 is left-handed.

Technical effects of the present disclosure are that the present disclosure provides a material of a light emitting layer 10 and a manufacturing method thereof, and the emitted light may be modulated to the circularly polarized light by using the chiral properties of the material of the light emitting layer 10. In comparison to synthesizing the light emitting material which directly emits the circularly polarized light, the method is easily achieved, and the compatibility of the material is high. The present disclosure also provides an electroluminescent device 20. The light emitting layer 21 of the electroluminescent device employs the material of the light emitting layer 10. The light extraction efficiency may be increased by 40% to 50% by changing the polarization state of the light emitted by the electroluminescent device 20 and using the circular polarizer, thereby enhancing the light extraction efficiency of the device, and improving the light-emitting lifespan of the electroluminescent device 20 as well.

The above description is only the preferred embodiments of the present disclosure. It should be noted that some improvement and modifications can be made by those skilled in the art without departing from the inventive principles of the present disclosure, and all of the improvement and modifications are regarded as the protective scope of the present disclosure.

What is claimed is:

1. A manufacturing method of material of a light emitting layer, comprising steps of:

manufacturing a spiral nanotube structure and providing luminescent particles; and mixing a quantity of the spiral nanotube structure with a quantity of the luminescent particles to obtain a mixture, adding the mixture to a dimethylformamide solvent, and heating the mixture and the dimethylformamide solvent in a closed environment until the mixture is dissolved in the dimethylformamide solvent, followed by standing and cooling the mixture to a room temperature, so that the luminescent particles are uniformly distributed in the spiral nanotube structure, wherein the step of manufacturing the spiral nanotube structure comprises:

placing N-tert-butoxycarbonyl-L-glutamic acid, octadecylamine, and a catalyst into a reaction vessel to fully react and obtain a first reaction solution, and adding tetrahydrofuran into the first reaction solution to dissolve residual reactants, thus purifying and obtaining intermediate compounds;

placing the intermediate compounds, dichloromethane, and trifluoroacetic acid into a reaction vessel to fully react and obtain a second reaction solution, using a rotary evaporator to remove excess solvent in the second reaction solution, and dissolving residual reactants in tetrahydrofuran, followed by adding the residual reactants into sodium bicarbonate solution, thus obtaining a target compound being a white and solid substance;

adding the target compound into tetrahydrofuran, and performing recrystallization purification; and mixing a quantity of the purified target compound with a quantity of alcohol solvent to obtain a mixture, heating the mixture to boil in a closed environment, and cooling the mixture to a room temperature, thus forming the spiral tube structure.

2. The manufacturing method of the material of the light emitting layer according to claim 1, wherein when a particle diameter of the luminescent particles ranges from 20 nm to 40 nm, a proportion of the spiral nanotube structure to the luminescent particles is (10 to 17):1; and when the particle diameter of the luminescent particles is equal to or greater than 1 nm and less than 20 nm, and/or is greater than 40 nm and equal to or less than 100 nm, the proportion of the spiral nanotube structure to the luminescent particles is (5 to 30):1.

* * * * *